(12) United States Patent
Hsieh

(10) Patent No.: US 6,281,827 B1
(45) Date of Patent: Aug. 28, 2001

(54) METHOD OF CONVERTING DIGITAL SIGNAL TO ANALOG SIGNAL

(75) Inventor: Kuan-Hong Hsieh, Taipei (TW)

(73) Assignee: Onemore Inc., Taipei (TW)

( * ) Notice: Subject to any disclaimer, the term of this patent is extended or adjusted under 35 U.S.C. 154(b) by 0 days.

(21) Appl. No.: 09/295,586

(22) Filed: Apr. 22, 1999

(51) Int. Cl.[7] ................................................. H03M 1/82
(52) U.S. Cl. ................................................. 341/152; 341/144
(58) Field of Search .................................. 341/152, 144, 341/146, 118, 117, 153, 156, 120

(56) References Cited

U.S. PATENT DOCUMENTS

| | | | |
|---|---|---|---|
| 3,648,275 | * | 3/1972 | Bower ................................. 341/152 |
| 4,163,287 | * | 7/1979 | Munter et al. ..................... 341/75 |
| 4,835,535 | * | 5/1989 | Shibayama et al. .................. 341/120 |
| 4,837,573 | * | 6/1989 | Broks .................................. 341/144 |
| 5,406,284 | * | 4/1995 | Lin et al. ............................ 341/152 |

* cited by examiner

*Primary Examiner*—Peguy JeanPierre
*Assistant Examiner*—Jean Bruner Jeanglaude
(74) *Attorney, Agent, or Firm*—Rabin & Champagne, P.C.

(57) ABSTRACT

A digital-to-analog conversion method includes outputting one priority bit of a digital signal to a digital output port to produce a respective output signal. An output time for the output signal is obtained by multiplying a unit of time by a weight of coding representing the significance of the bit, to define a period of time of maintaining the signal level at the output port before shifting to a next bit, and repeating the aforesaid steps for the successive bits. The output signal produced can be used to directly drive a power switching means for linear control of a power element, or integrated and filtered to provide a level analog output.

5 Claims, 11 Drawing Sheets

METHOD OF CONVERTING DIGITAL SIGNAL TO ANALOG SIGNAL

BACKGROUND OF THE INVENTION

The present invention relates to a signal conversion method, and more particularly to a method of converting digital signal to analog signal.

Conventional methods of converting digital signal to analog signal include the voltage (current) weighted method, the R-2R network method, and the pulse width modulation method.

Referring to FIG. 1, the voltage (current) weighted uses 8,4,2,1 binary weight ratios to achieve digital to analog conversion. According to this conversion method, we can obtain $V_O=V_R\times(A\times2^3+B\times2^2+C\times2^1+D\times2^0)$. The circuit for this voltage (current) weighted method is complicated. When the number of bits to be computed and the number of outputs are increased, the number of operational circuits must be relatively increased by a factor of $2^n$. Therefore, the cost of this method is high. Because the difference between MSB (the most significant bit) and LSB (the least significant bit) is large, the total accuracy is difficult to control the tolerance of MSB usually affects the tolerance and linearity of LSB a lot.

Referring to FIG. 2, the R-2R network method is similar to the voltage (current) weighted method. The difference of in the element value, as of element between MSB and LSB in the converting circuit according to R-2R network method is less significant, and can be relatively easily controlled, however the elements required for the converting circuit are complicated.

Referring to FIGS. 3 and 4, PWM (the pulse width modulation method) improves the drawbacks of low accuracy and complicated circuit structure, however it needs to run complicated comparison and switching actions. Because the frequency of actions is increased by a factor $2^n$, the drawbacks of high noise, high power consumption, low speed and poor linearity become inevitable.

SUMMARY OF THE INVENTION

It is one object of the present invention to provide a digital-to-analog conversion method which is simple, low cost, and highly efficient. It is another object of the present invention to provide a digital-to-analog conversion method, which achieves high linearity and high accuracy, and can directly process different bit lengths of or different encoding weights of codes. It is still another object of the present invention to provide a digital-to-analog conversion method which achieves high operation frequency but requires low power consumption. It is still another object of the present invention to provide a digital-to-analog conversion method, which is applicable for use to directly control any of a variety of circuits, and it is particularly suitable for multiple bit, multiple output applications.

The digital-to-analog conversion method of the present invention comprises the steps of:

(a) Processing at least one digital code;
(b) Inputting each of said at least one digital code to a single digital output port bit by bit for producing a respective analog signal;
(c) Multiplying a unit of time by a weight of encoding that represents the ongoing bit, so as to obtain an output period of time for the respective bit;
(d) Shifting to the next bit, then continuously repeating steps (b) and (c) till the last bit of each of said at least one digital code has been processed, and then continuously repeating the process.

According to the present invention, except for a reference voltage, the other elements produce almost no tolerance, therefore the amount of tolerance and the switching time can be excluded from calculation, and the accuracy is relatively high. For N bits operation, only an N bit register and/or latch are needed. The cost is therefore very low in comparison with conventional methods of which complexity and cost are increased by factor of $2^n$. The invention requires data shift only N times data shift. Therefore, linearity and speed can be much higher, and power consumption can be much lower in comparison with the conventional pulse width modulation solution. Furthermore, the process of the present invention is very simple, so that it can be achieved by only firmware or software solution by simply moving all same priority bits to output ports for a defined time. It is particularly suitable for applications of non-binary code, long code, and multi-output/input conversion, which can be achieved without significant extra cost or load. Analog output can control a high-speed power switching means to directly drive a power element such as an electromagnetic field speaker, electric heater, lamp, or DC motor.

DETAILED DESCRIPTION OF THE PREFERRED EMBODIMENT

The operating principle and structure of the present invention arc described hereinafter by way of example, with reference to FIGS. 5 through 12.

Figure 1:
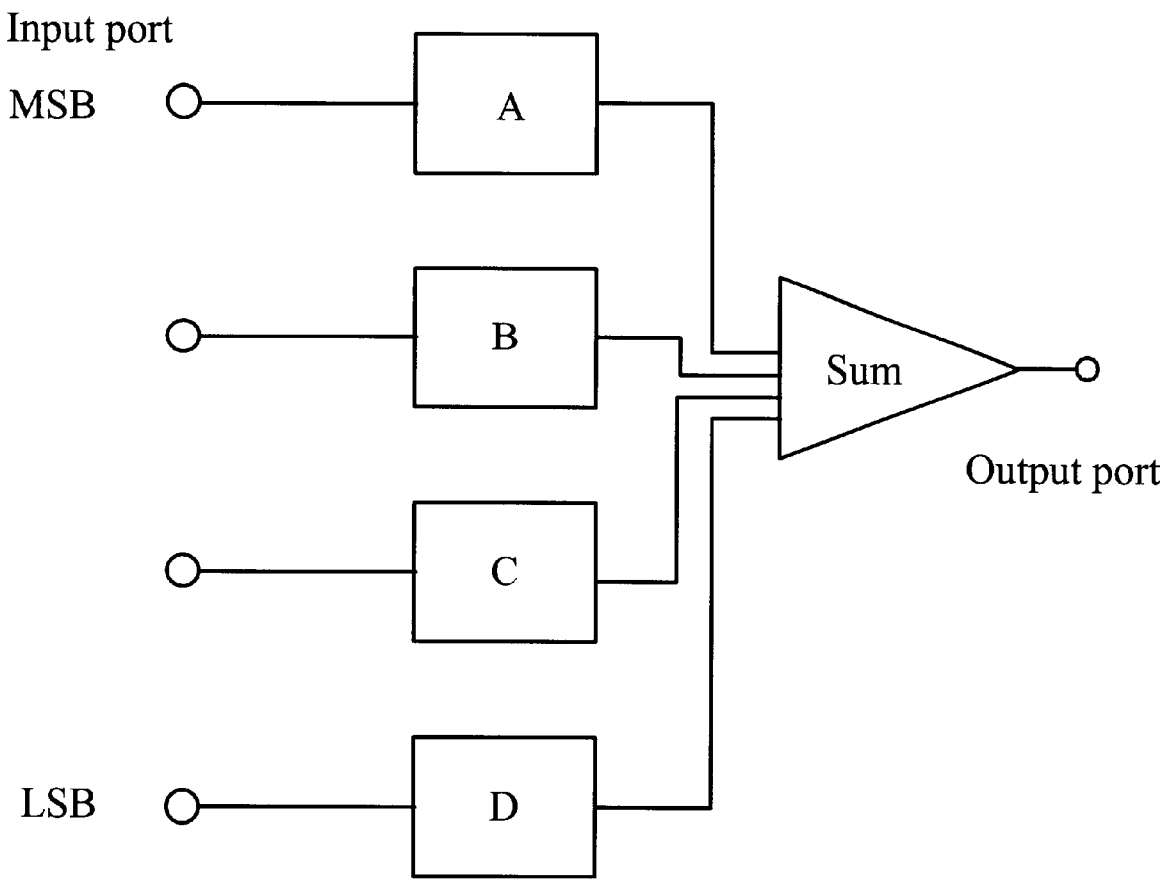
FIG. 1 is a circuit block diagram for a voltage (current) weighted type digital-to-analog conversion method according to the prior art.
Figure 2:
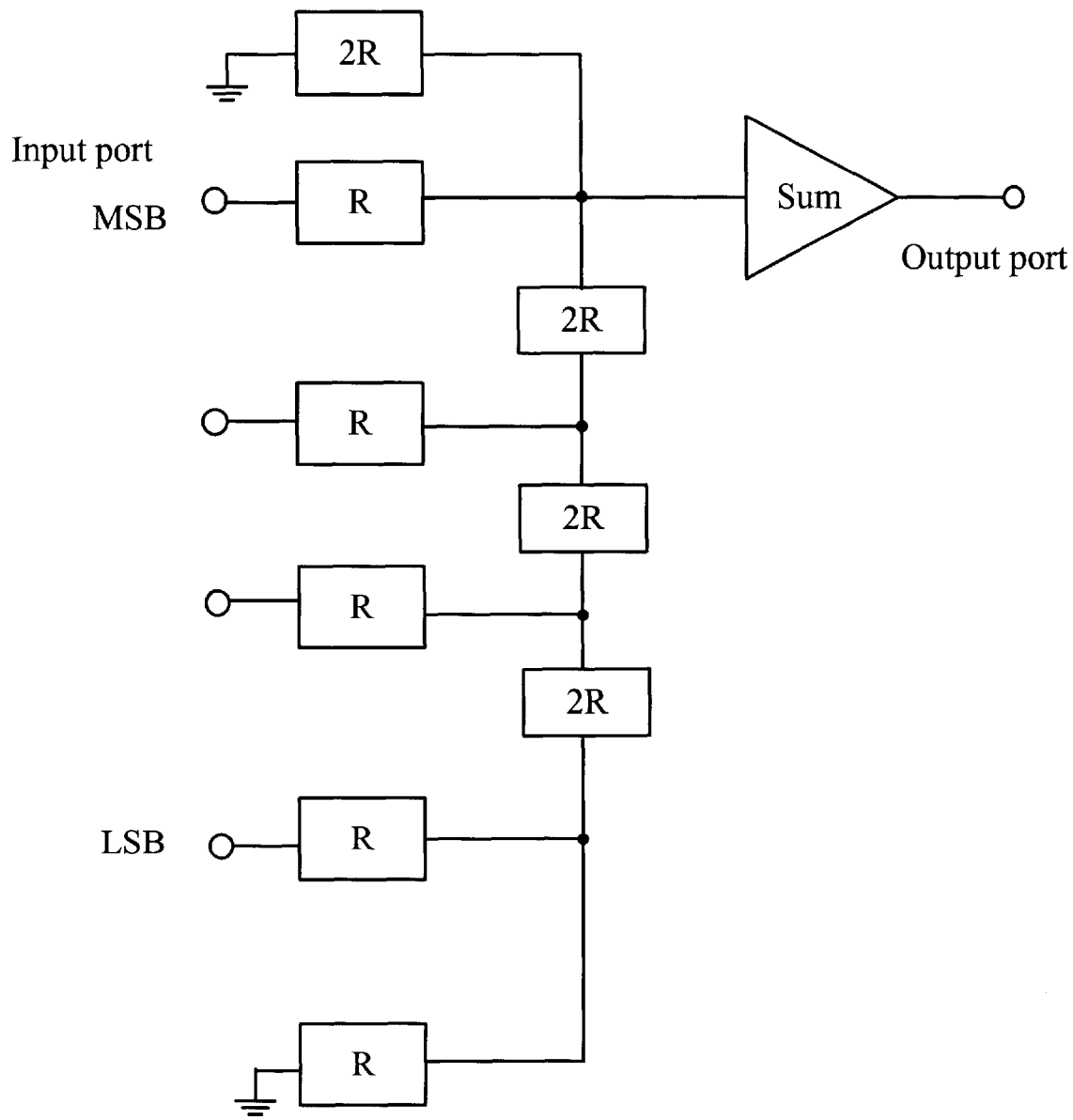
FIG. 2 is a circuit block diagram for a R-2R network type digital-to-analog conversion method according to the prior art.
Figure 3:
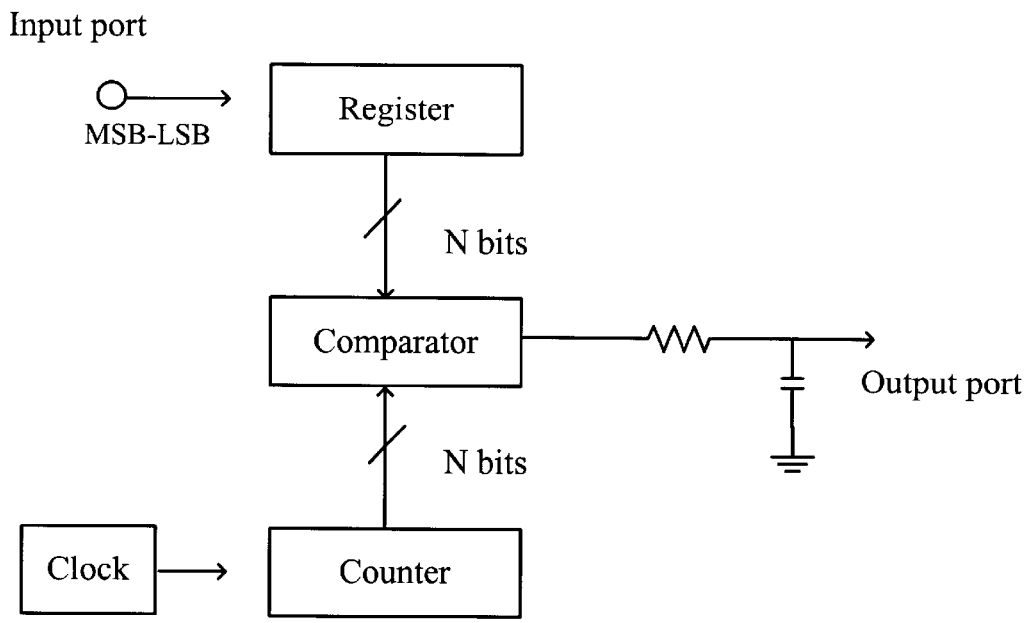
FIG. 3 is a circuit block diagram for a pulse width modulation type digital-to-analog conversion method according to the prior art.
Figure 4:
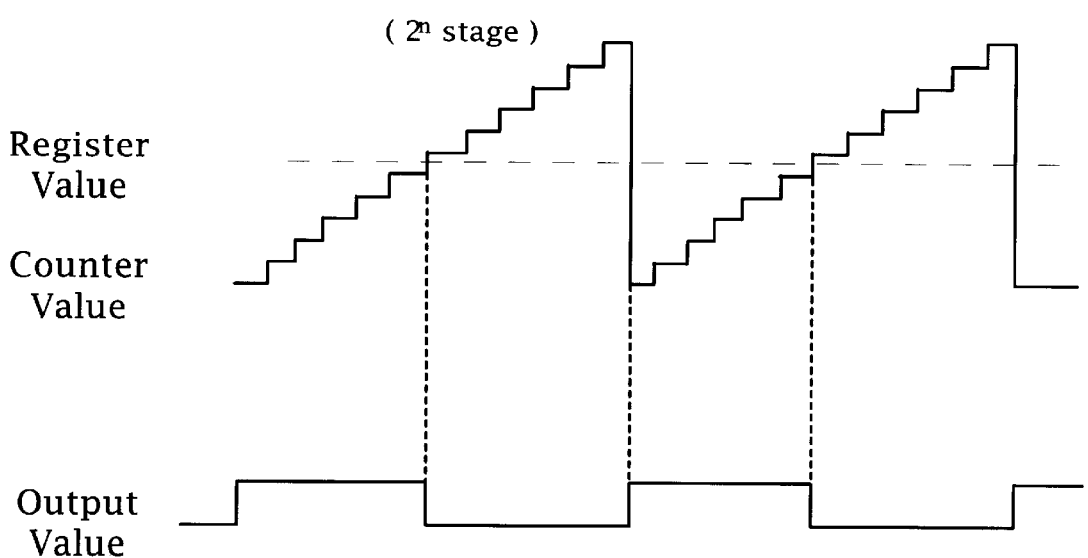
FIG. 4 is a time-sequence chart according to a conventional pulse width modulation type digital-to-analog conversion method.
Figure 5:
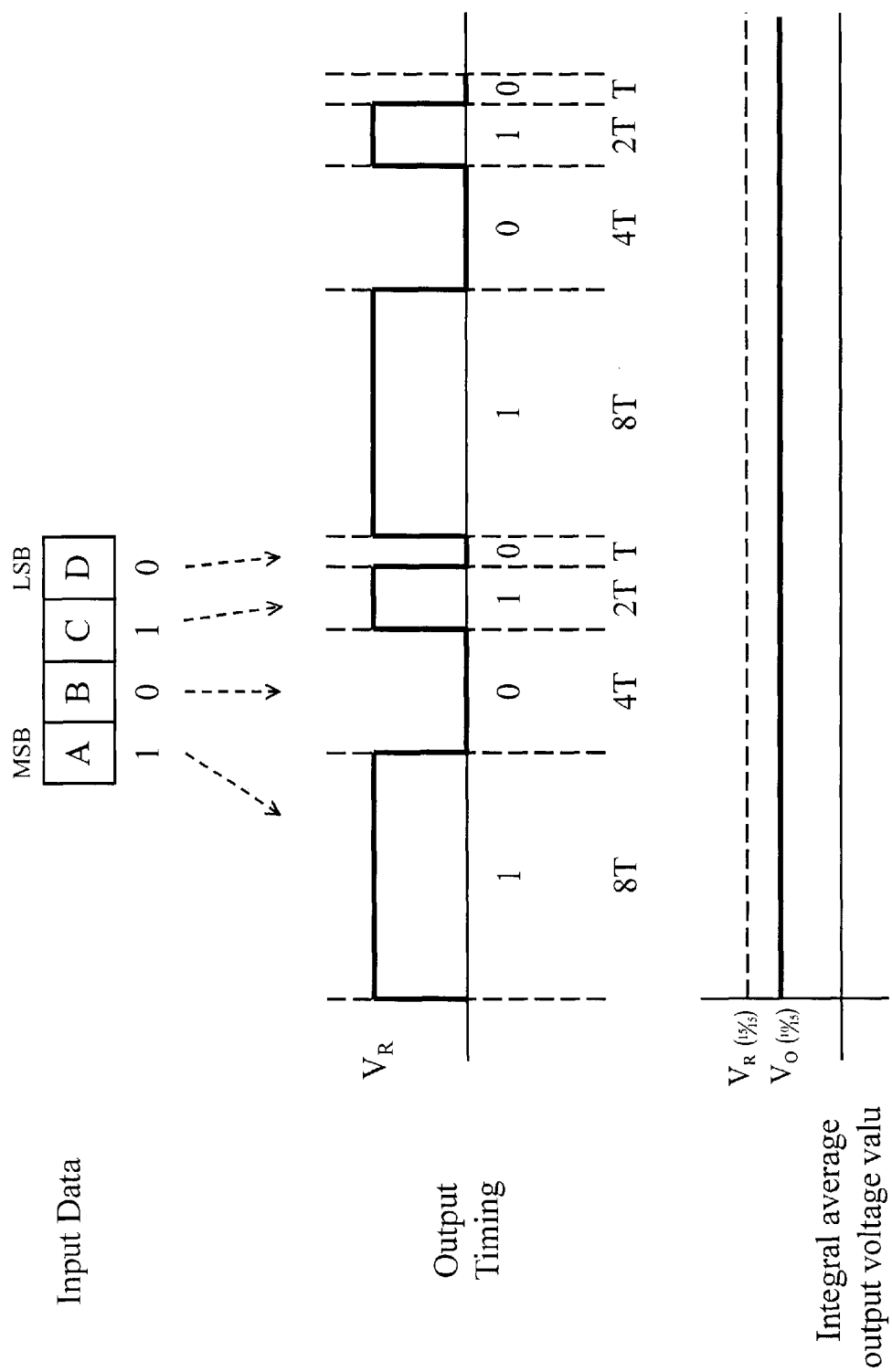
FIG. 5 illustrates the principle of operation and time sequence of the present invention.

As illustrated in FIG. 5, assume there is a four bit binary code, which has four digits "ABCD", from MSB (the most significant bit) to LSB (the least significant bit), the weights of encoding for "ABCD" being "8421", as ($2^{n-1}$) in a binary system. We move the code "ABCD" bit by bit from MSB to LSB onto a single digital output, and delay or remain for a period of time given by "unit of time×weight of encoding" which represents the ongoing bit, so that the Integral Average Output Voltage value $V_O$ will be Reference Voltage $V_R$×Duty Cycle:

$$V_O = V_R \times Duty\ Cycle$$

$$= \frac{\int_0^{8T} A\,dt + \int_{8T}^{12T} B\,dt + \int_{12T}^{14T} C\,dt + \int_{14T}^{15T} D\,dt}{8T + 4T + 2T + 1T}$$

$$= V_R \times \frac{A \cdot 2^3 \cdot T + B \cdot 2^2 \cdot T + C \cdot 2^1 \cdot T + D \cdot 2^0 \cdot T}{2^3 \cdot T + 2^2 \cdot T + 2^1 \cdot T + T}$$

$$= V_R \times \frac{8A + 4B + 2C + D}{15}$$

The output waveform is output A (0 or $V_R$) for 8 units of time, output B (0 or $V_R$) for 4 units of time, output C (0 or $V_R$) for 2 units of time, and output D (0 or $V_R$) for 1 unit of time. This process should be repeated continuously, and the output can be averaged or directly driven for an analog control application.

Figure 6:
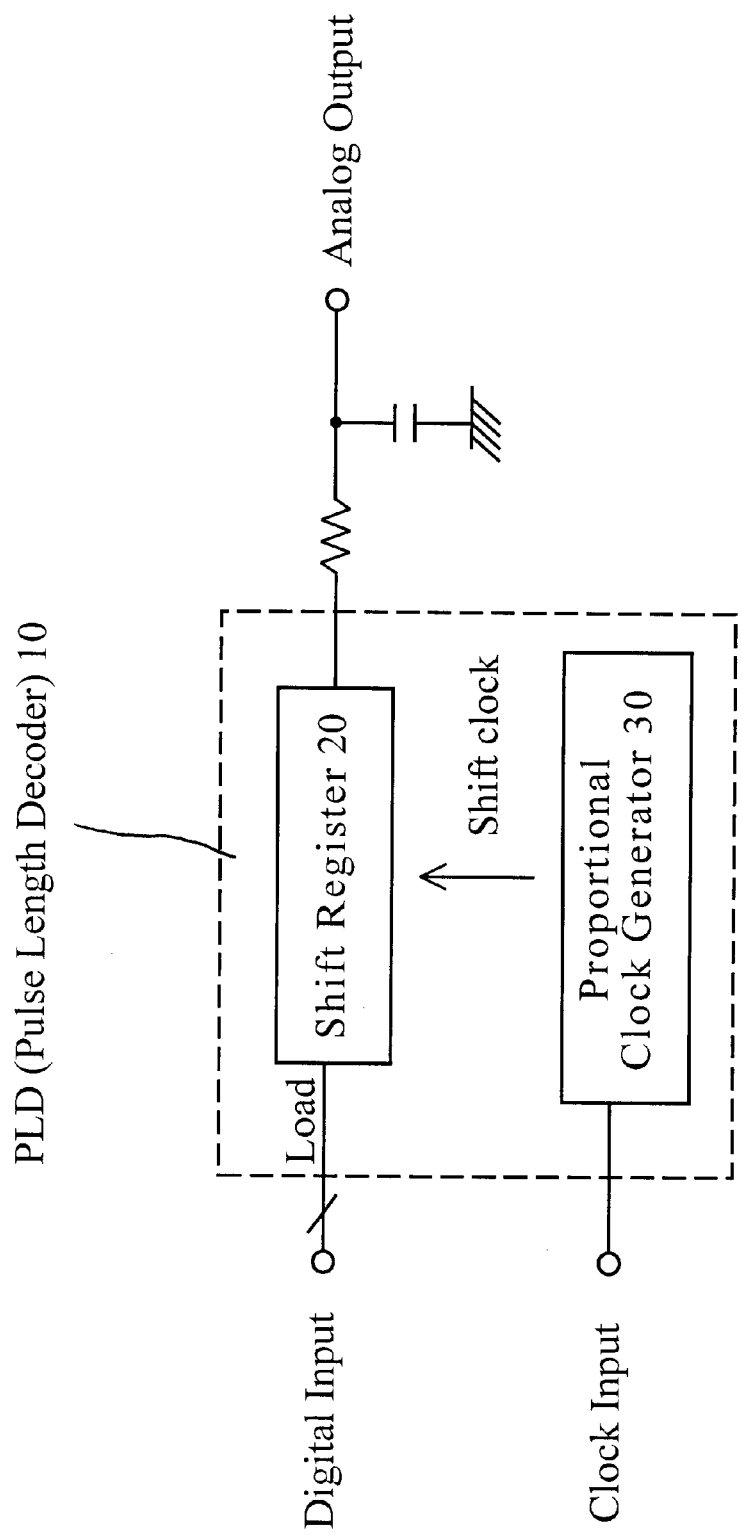
FIG. 6 is a hardware circuit block diagram of the present invention.

Referring to FIG. 6, the digital to analog converting circuit is comprised of a PLD (pulse length decoder) 10. The digital code is loaded on the Shift Register 20 of the PLD 10, enabling the code to be outputted from the left to the right bit by bit (it can also be outputted in direction from the right to the left). The movement is continuously repeated. A timing pulse is generated from a Proportional Clock Generator 30. When a clock signal is inputted into the Proportional Clock Generator 30, it matches each period of timing pulse with the weight ratio of every bit to drive the Shift Register 20, enabling the Shift Register 20 which can act to match the loaded digital code information and the inputted timing pulse, and output its pulse length to represent analog information, so that the output can be averaged or directly driven for an analog control application.

Figure 7:
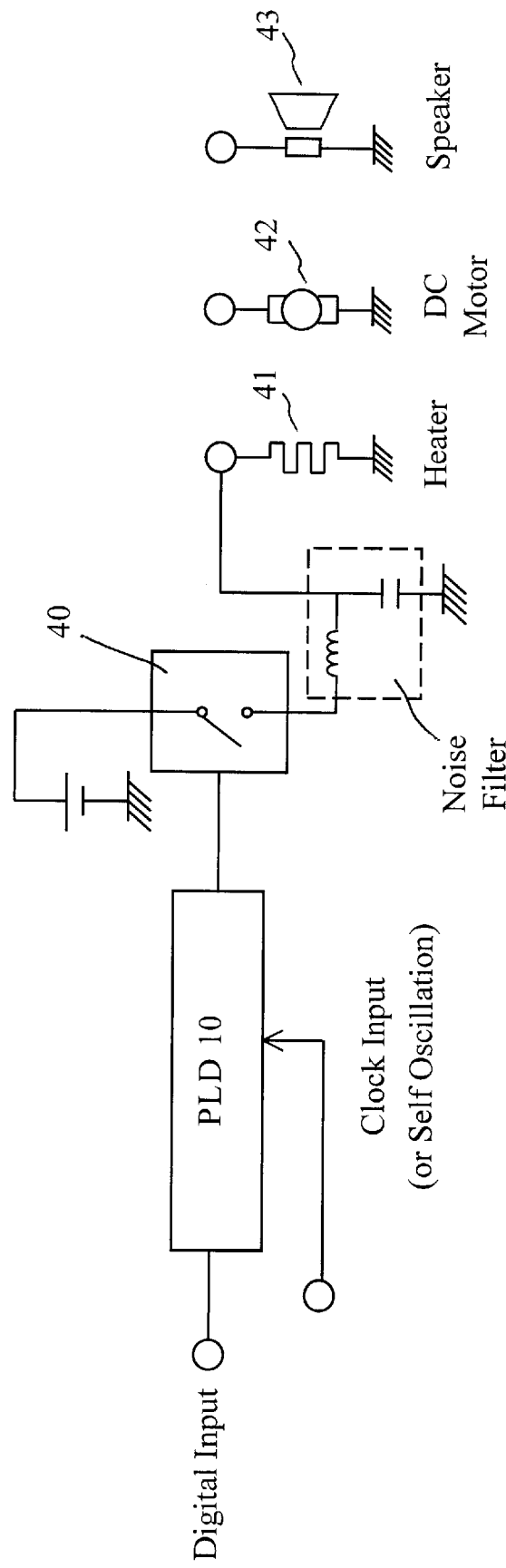
FIG. 7 is a circuit block diagram showing an application example of the hardware circuit shown in FIG. 6.

FIG. 7 illustrates the analog output from the PLD 10 directly driving a high speed power switch 40, causing it to output corresponding high power output for driving an electric heater 41, DC motor 42, or electromagnetic field speaker 43. Therefore, a satisfactory result of linear control or output can be achieved without any digital-to-analog converter means, amplifier or power driver means.

Figure 8:
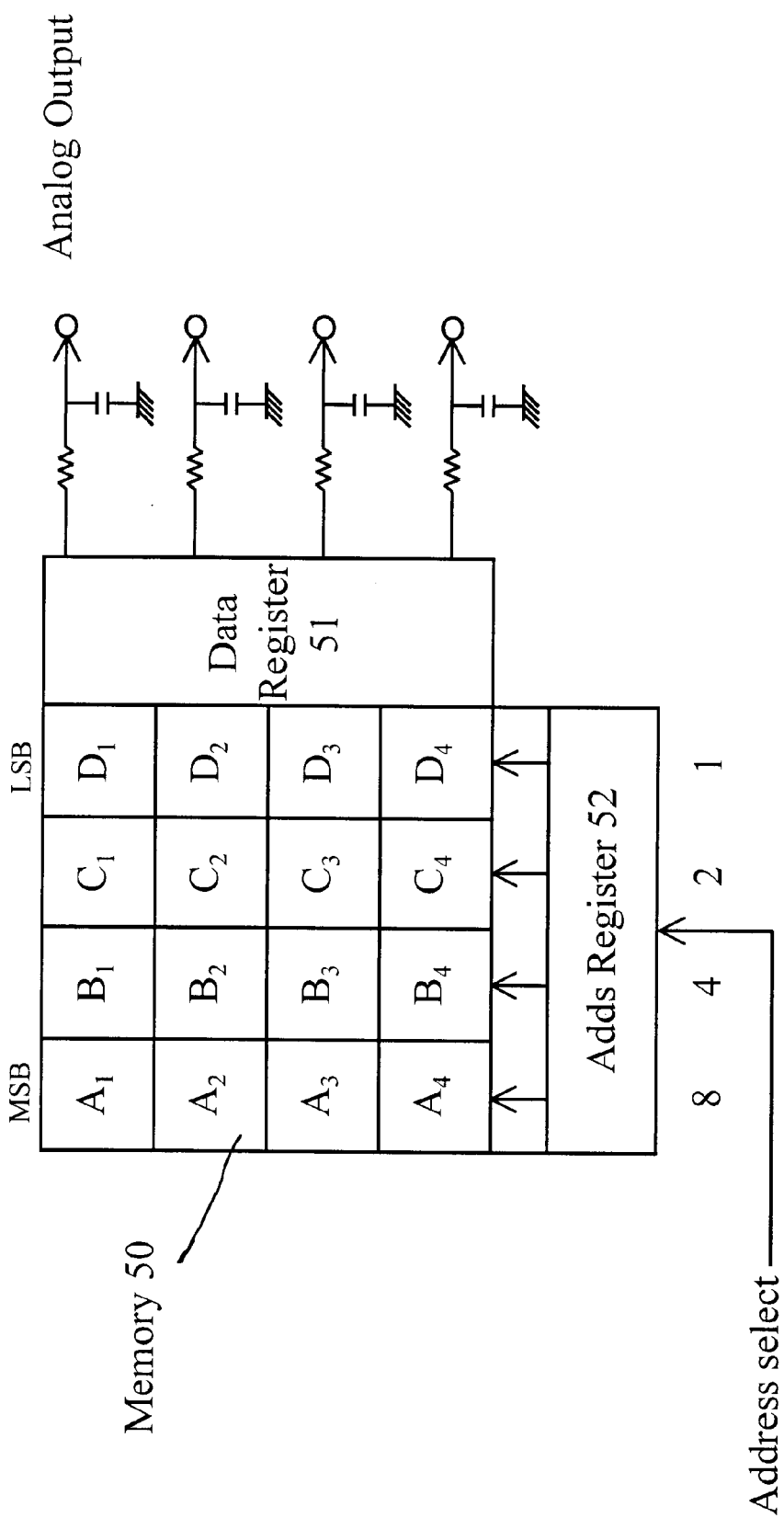
FIG. 8 is a circuit block diagram showing the use of the digital-to-analog conversion method with a memory according to the present invention.

Referring to FIG. 8, the present invention can be used with a Memory 50 to achieve a digital-to-analog converting process. This arrangement uses minimized memory space (word×channel) to achieve a digital-to-analog converting process without using any memory space or circuit beyond the quantities of digital code. Therefore, this architecture is suitable for multiple bit, multiple output application.

Upon each operation, the Address Register 52 selectively outputs the same bit from every digital code to the Data Register 51, and controls the output time of ongoing bit data, in which "encoding output time" is equal to "unit of time× weight of encoding of the bit". It delays or remains for a period of time equal to "unit of time×weight of encoding" which represents the ongoing bit. The process is repeated continuously bit by bit. Therefore, multiple channels of digital codes or multiple bits of digital code can be easily and rapidly converted into corresponding analog signals.

Figure 9:
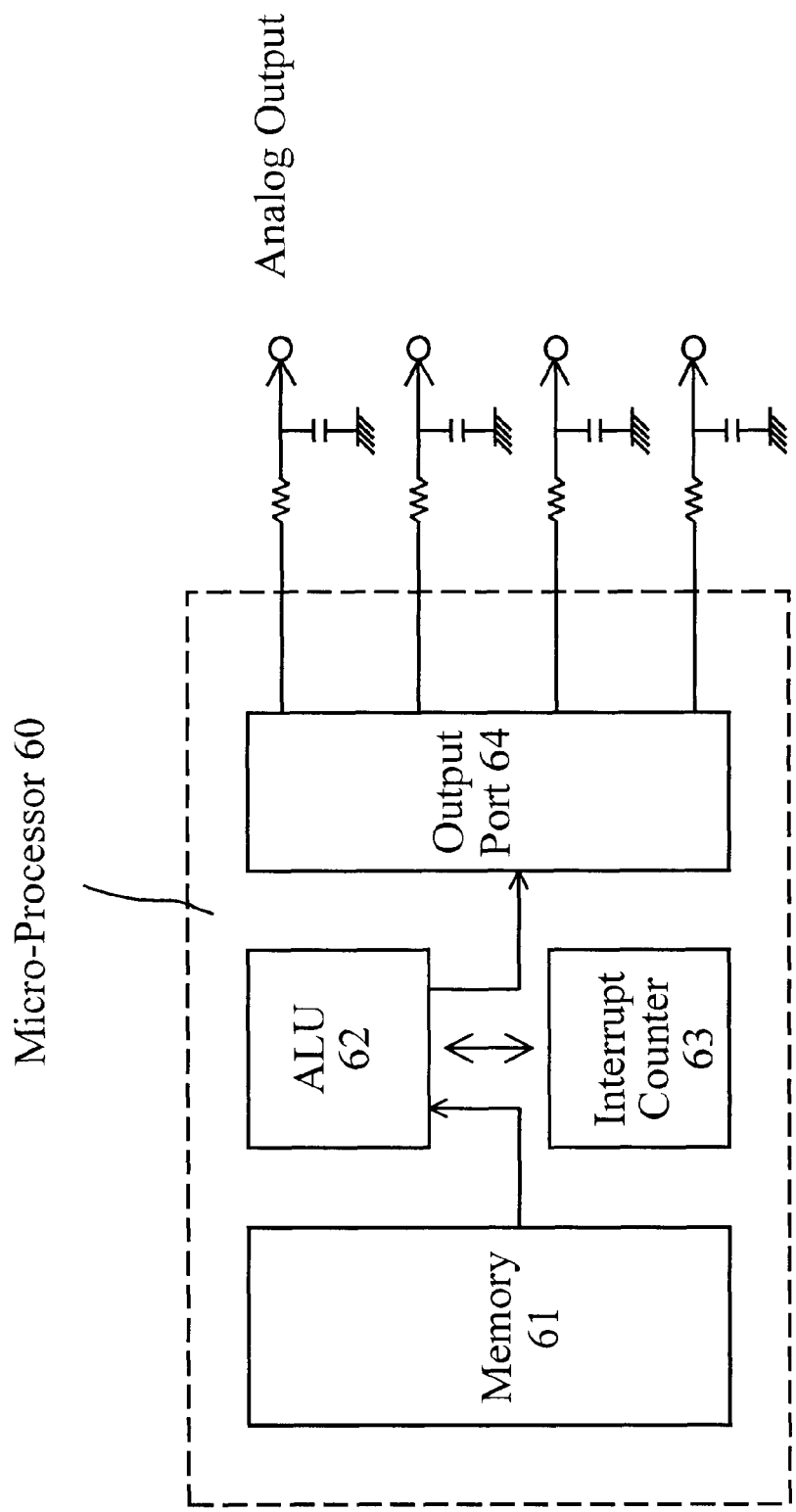
FIG. 9 is a circuit block diagram showing the use of the digital-to-analog conversion method with a Micro-Processor according to the present invention.

Referring to FIG. 9, the present invention can also be used with a Micro-Processor 60 to achieve a digital-to-analog converting function, in which the Memory 61 is in charge of storing digital code to be processed; the ALU (Arithmetic Logic Unit) 62 matches with the Interrupt Counter 63 to control time delay of output, enabling processed information to be sent to the Output Port 64, and then outputted in the form of analog information. Therefore, this arrangement uses a regular output port for temporary storage of ongoing data, and an interrupt counter to achieve proportional output timing control, so that digital-to-analog converting process can be simplified as a combination of only outputting data and time counting actions.

Figure 10:
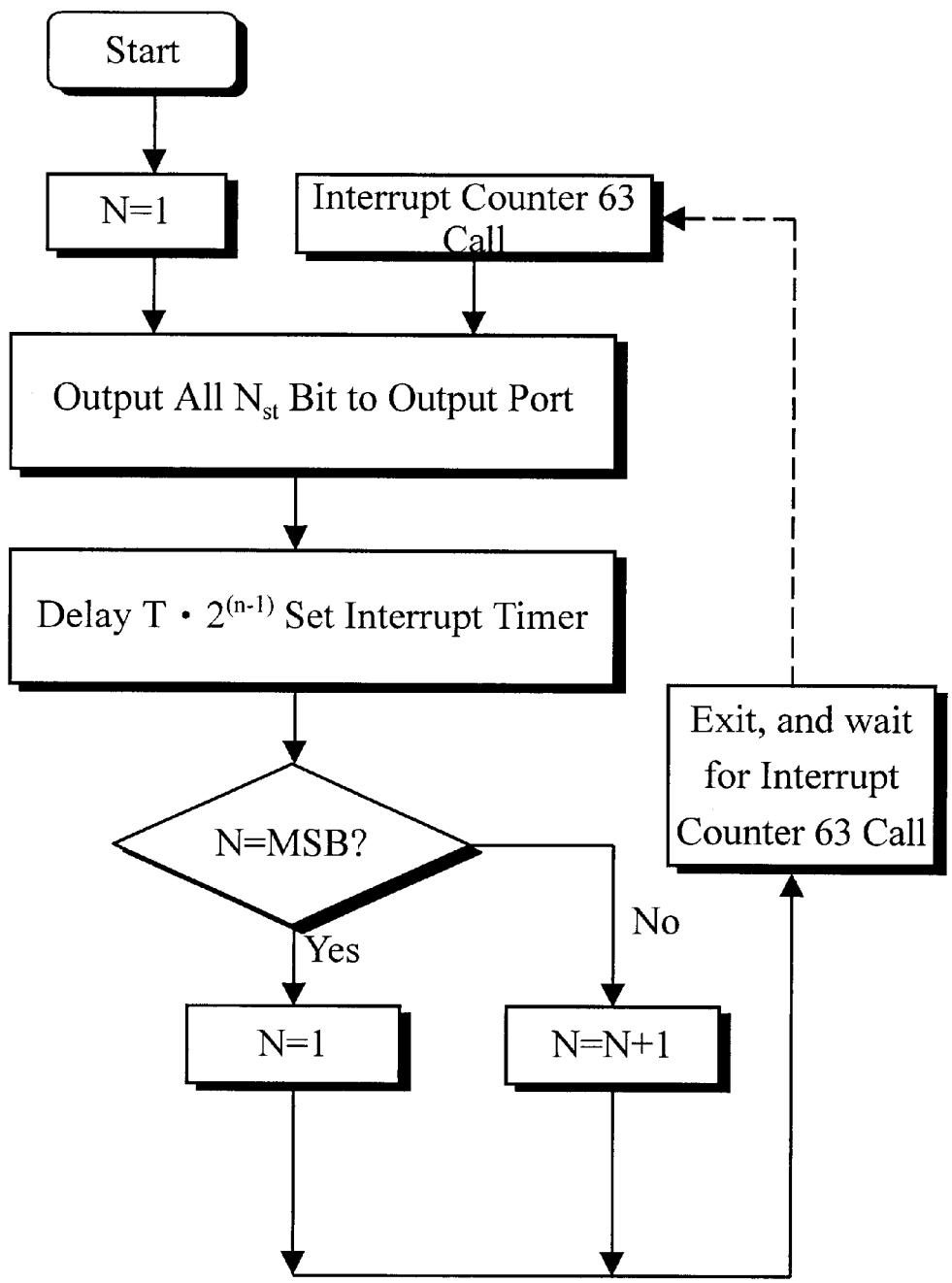
FIG. 10 is an operation flow chart explaining the operation of the circuit shown in FIG. 9.

FIG. 10 is a digital-to-analog converting process flow chart under the architecture shown in FIG. 9. When started, it outputs the same bit of all of the codes to the Output Port 64, and uses the Interrupt Counter 63 to set up the delay time, and then selects the next bit from every code and delays the time that represents by that ongoing bit. This process is repeated continuously. For example, for an eight bit binary code, one transfer cycle is done through eight actions. During the interrupt waiting time interval, the Micro-Processor 60 can run other tasks.

Figure 11:
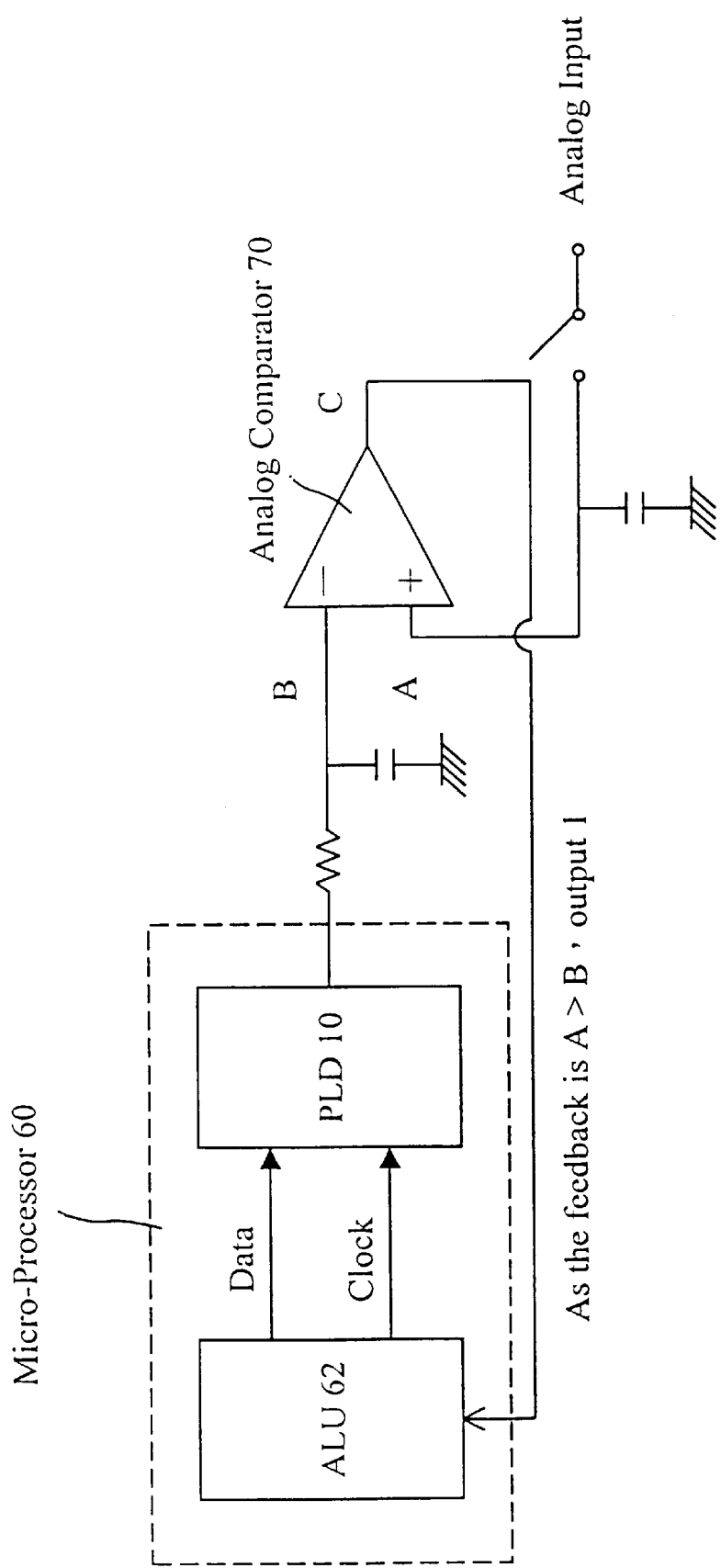
FIG. 11 is a circuit block diagram showing an analog-to-digital conversion application example of the present invention.

Referring to FIG. 11, the concept of the present invention can be used with an Analog Comparator to achieve an analog-to-digital converting process. When this method is used, test value B and input value A are continuously compared, and the comparison result C is fed back to the Micro-Processor 60 for determination of the set-up of the bit.

Figure 12:
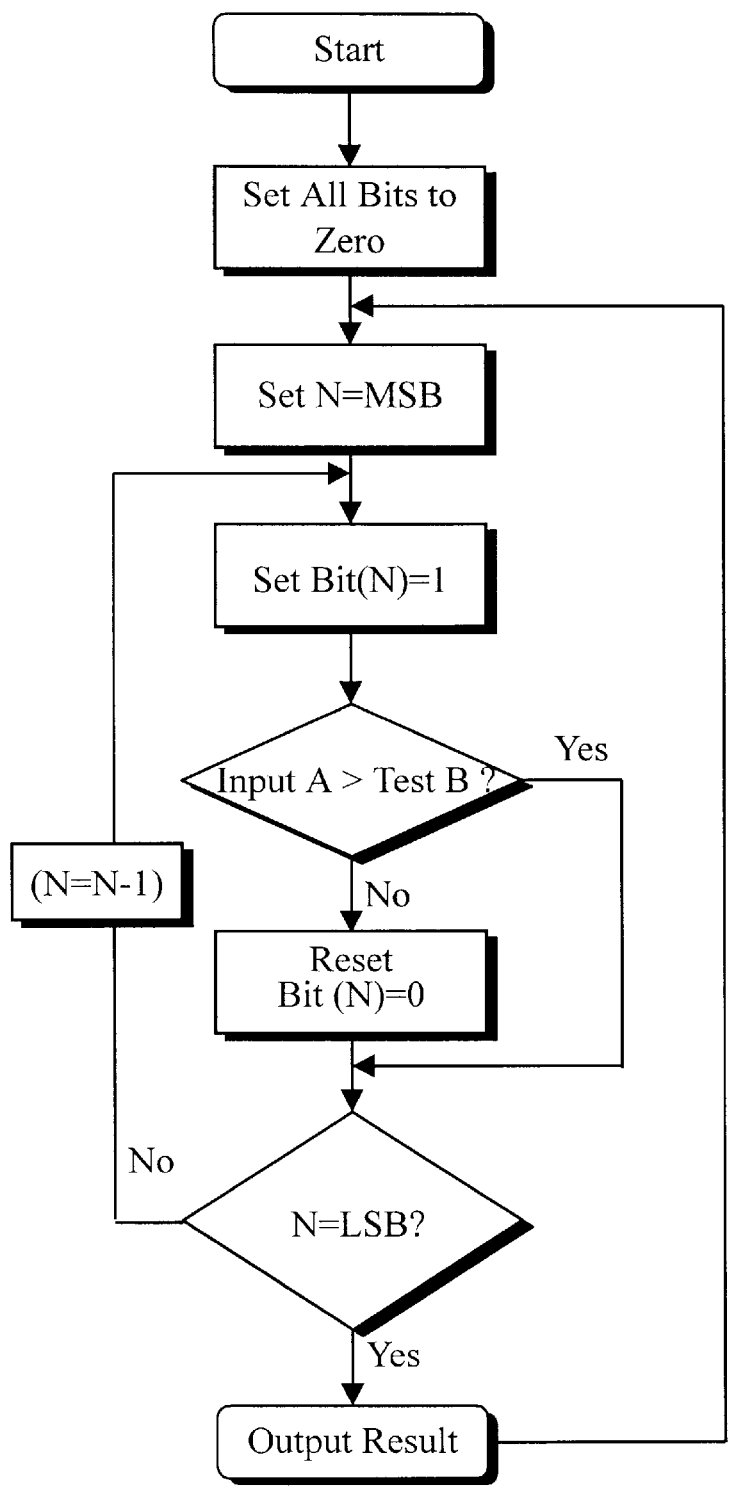
FIG. 12 is an operation flow chart explaining the operation of the circuit shown in FIG. 11.

FIG. 12 is an analog-to-digital conversion flow chart according to the present invention. The test is started from MSB (the most significant bit). The bit is set for "1". After a period of time, the Comparator output is tested. In a case in which the test result indicates that the test value surpasses the input value, the bit is reset for "0". If not, it is maintained a "1", and then the test is shifted to a next bit. This process is repeated continuously. After the end of every transfer cycle, the set value for every bit (MSB to LSB) will be the converted result.

What the invention claimed is:

1. A method of converting a digital signal to an analog signal, comprising the steps of:
   providing a digital code having a plurality of bits including a starting bit and an ending bit;
   outputting the digital code to a digital output port bit-by-bit, starting with the starting bit and ending with the ending bit, to produce a signal level at the output port that varies according to the value of the ongoing bit;
   multiplying a unit of time by a weight of coding that represents the ongoing bit, so as to obtain an output time segment for the respective bit, said step of outputting the digital code including
   holding the signal level at the output port for said output time segment, and
   then shifting to a next ongoing bit; and
   repeating said multiplying and holding successively for each successive bit of the digital code until the ending bit of the digital code has been processed, thereby to provide the analog signal converted from the digital signal at the output port.

2. The method of claim 1, wherein the digital code is one digital code and is followed successively by further digital codes, and wherein the method further comprises repeating said providing step, said outputting step, said multiplying step and said repeating step from the starting bit to the ending bit successively for each of the further codes to extend the analog signal continuously.

3. The method of claim 2, further comprising the step of providing linear control of a power element by directly driving a switching structure thereof with the extended analog signal.

4. A method of converting a digital signal to an analog signal, comprising the steps of:

provided a digital code having a plurality of bits including a starting bit and an ending bit;

outputting the digital code to a digital output port bit-by-bit, starting with the starting bit and ending with an ending bit, to produce a signal level at the output port that varies according to the value of the ongoing bit;

multiplying a unit of time by a weight of coding that represents the ongoing bit, so as to obtain an output time segment for the respective bit, said step of outputting the digital code including holding the signal level at the output port for said output time segment, and then shifting to a next ongoing bit; and repeating said multiplying and holding successively for each successive bit of the digital code, thereby to provide the analog signal, during the successive output time segments for the respective bits of the digital code, to have signal levels corresponding to successive bits of the digital code.

5. A method according to claim 4, further comprising the step of integrating and filtering the analog signal to provide a level analog output.

* * * * *